United States Patent [19]

Lynch et al.

[11] Patent Number: 4,996,576
[45] Date of Patent: Feb. 26, 1991

[54] RADIATION-SENSITIVE DEVICE

[75] Inventors: William T. Lynch, Summit; Lalita Manchanda, North Plainfield, both of N.J.

[73] Assignee: AT&T Bell Laboratories, Murray Hill, N.J.

[21] Appl. No.: 355,053

[22] Filed: May 15, 1989

Related U.S. Application Data

[63] Continuation of Ser. No. 933,913, Nov. 24, 1986, abandoned.

[51] Int. Cl.[5] ............... H01L 29/78; H01L 31/10
[52] U.S. Cl. .................... 357/29; 357/23.12; 357/23.14; 357/23.15; 357/59; 250/370.07
[58] Field of Search ............ 357/23.12, 23.14, 23.15, 357/29, 25, 59; 250/370 K, 370.07

[56] References Cited

U.S. PATENT DOCUMENTS

| | | | |
|---|---|---|---|
| 3,673,471 | 6/1972 | Klein et al. | 357/59 G |
| 3,803,461 | 4/1974 | Beneking | 357/23.14 |
| 3,882,530 | 5/1975 | Danchenko | 357/29 |
| 3,886,584 | 5/1975 | Cook et al. | 357/29 |
| 4,012,762 | 3/1977 | Abe et al. | 357/23.15 |
| 4,163,240 | 7/1979 | Swinehart et al. | 357/29 |
| 4,176,372 | 11/1979 | Matsushita et al. | 357/23.15 |
| 4,213,045 | 7/1980 | Fraass | 250/370 |
| 4,273,805 | 6/1981 | Dawson et al. | 357/59 G |
| 4,605,946 | 8/1986 | Robinson, Jr. | 357/23.1 |

OTHER PUBLICATIONS

Sze, *Physics of Semiconductor Device*, N.Y., 1981, pp. 453-456.

*Primary Examiner*—Jerome Jackson, Jr.
*Attorney, Agent, or Firm*—Bruce S. Schneider

[57] ABSTRACT

A p-channel depletion-mode MOS device is utilized for measuring low levels of ionizing radiation.

7 Claims, 1 Drawing Sheet

RADIATION-SENSITIVE DEVICE

This application is a continuation of application Ser. No. 933,913, filed on Nov. 24, 1986, now abandoned.

BACKGROUND OF THE INVENTION

This invention relates to measuring radiation and, more particularly, to a semiconductor device for measuring low-level doses of ionizing radiation.

In a number of medical, military and other applications, it is important to be able to measure the dose of ionizing radiation to which an animate or inanimate object is exposed. Ideally, the instrumentality utilized to measure dosage should be low in cost, reliable and sensitive.

Detecting radiation at low levels (for example, radiation in the range of 10-to-100 rads) requires a particularly sensitive device. (A rad is a unit of radiation dose equal to the quantity of ionizing radiation that results in the absorption of 100 ergs of energy per gram of irradiated material.)

Devices of the metal-oxide-semiconductor (MOS) type have been suggested for use as radiation detectors. But, heretofore, in practice the sensitivity of such devices has generally been insufficient to enable them to be employed as effective radiation detectors in the aforespecified low-level range.

SUMMARY OF THE INVENTION

Hence, an object of the present invention is an improved device for measuring radiation. More specifically, an object of this invention is an MOS device for measuring low-level doses of ionizing radiation.

Briefly, these and other objects of the present invention are realized in a specific illustrative embodiment thereof that comprises a p-channel delpletion-mode MOS device. Illustratively, the device is fabricated in a process sequence designed to achieve a relatively high density of hole traps in the gate oxide thereof. Advantageously, the efficiency of trapping holes in the oxide is enhanced by utilizing n+polysilicon for the material of the gate electrode that overlies the oxide. Further, in one embodiment the device comprises a simple ring-gate design which includes no field oxide and is characterized by relative ease of fabrication.

BRIEF DESCRIPTION OF THE DRAWING

A complete understanding of the present invention and of the above and other features thereof may be gained from a consideratin of the following detailed description presented hereinbelow in connection with the accompanying drawing, not drawn to scale, in which.

DETAILED DESCRIPTION

Figure 1:
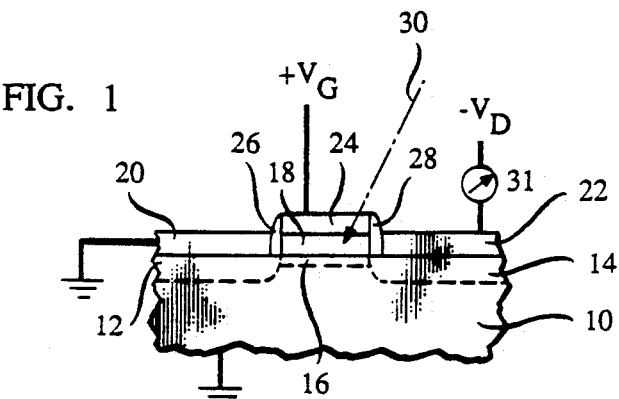
FIG. 1 is a schematic representation of a specific illustrative MOS device made in accordance with the principles of the present invention.

In accordance with the principles of applicants' invention, an MOS device is utilized to detect and measure low-level doses of ionizing radiation (for example, gamma rays or x-rays in the range of approximately 10-to-100 rads). Radiation incident on such a device causes a negative-direction change in the gate threshold voltage thereof, as is well known in the art. Applicants' invention is based in part on their recognition that, for a given dose of radiation, the change in threshold voltage in a p-channel device is greater than that in an n-channel device. Applicants' inventive device therefore comprises a p-channel MOS device.

The aforementioned change in threshold voltage in an MOS device arises from radiation-generated electron/hole pairs created in the gate oxide of the device. Electrons have considerable greater mobility in the oxide than do holes. In practice, radiation-generated electrons that escape initial recombination move in a matter of picoseconds to the conductive gate electrode that overlies the oxide. This leaves behind in the oxide a number of radiation-generated holes. Some of these holes are immobilized in the oxide by being trapped in hole-trap sites and, also, in donor-type interface states which are created by the incident radiation itself. It is these trapped holes or positive charges that cause a shift in the threshold voltage of the device.

In one embodiment of applicants' invention, the density of hole traps in the gate oxide of a p-channel MOS device is purposely enhanced during fabrication. (The particular ways in which this is done will be specified later below.) As a result, the likelihood of trapping radiation-generated holes in the oxide is increased. Consequently, for a given radiation dose, the shift in threshold voltage is greater than it would be without such enhancement. Importantly, the sensitivity of the device is thus improved.

Trapping of radiation-generated holes in an MOS device is most likely to occur in the vicinity of the interface that exists between the gate oxide and the underlying silicon surface. This is so because the density of hole-trap sites and donor-type interface states is greatest in this vicinity. Applicants took advantage of this phenomenon by recognizing that the likelihood of trapping holes in the gate oxide of the device could accordingly be further enhanced by deliberately establishing therein a field that tends to move the holes towards the interface.

Thus, in accordance with the principles of the present invention, the aforementioned p-channel MOS detector devised by applicants was designed to be a depletion-mode device. Such a device operates with a positive bias voltage applied to the gate electrode thereof. Significantly, this positive bias particularly enhances the radiation sensitivity of the specified device.

In further accord with the principles of the present invention, the gate electrode of applicants' p-channel depletion-mode device advantageously comprises n+-type polysilicon (rather than p+-type polysilicon or a metal). The use of n+-type polysilicon ensures that a relatively large positive electric field will exist in the gate oxide even in the absence of an external positive bias voltage connected to the gate electrode. This field is effective to move holes towards the gate oxide-to-silicon interface and thus to enhance the radiation sensitivity of the herein-specified device.

Accordingly, devices made in accordance with the principles of applicants' invention serve as effective radiation detectors in a variety of both on-line and off-line applications. For on-line applications, the device is operated with a positive bias voltage applied to the gate electrode and a negative bias voltage connected to the drain of the device. For a particular applied gate voltage, the change in drain current between the no-incident-radiation case and the case in which the device has been subjected to radiation is measured. This current change, which arises from a change in gate threshold voltage, is a direct indicator of incident radiation dose.

For off-line applications, applicants' device is exposed to radiation without any bias voltages applied thereto. (Prior to exposure, the drain current of the device is measured at a selected gate voltage). After exposure, the change if any in drain current, at the same selected gate voltage, is a direct indicator of incident radiation dose.

By way of a specific illustrative example, FIG. 1 schematically shows in cross section a portion of a p-channel depletion-mode MOS device made in accordance with the principles of the present invention. The depicted device may constitute a single discrete unit or be part of an integrated-circuit assembly. In the latter case, additional associated circuitry (not shown) is formed in the same wafer substrate in which the device is made.

The p-channel depletion-mode MOS device shown in FIG. 1 comprises an n-type silicon substrate 10 having $p^+$ source and drain regions 12 and 14, respectively, formed therein. The substrate 10 also includes a p-type channel region 16 extending between the regions 12 and 14.

Disposed on the top surface of the substrate 10 of FIG. 1 are a gate oxide portion 18 and conductive portions 20 and 22 made, for example, of a metal or doped polysilicon. A coductive portion 24 overlies the gate oxide portion 18. Advantageously, as discussed earlier above, the conductive portion 24 comprises $n^+$-type polysilicon. The portions 20, 22 and 24 comprise the source, drain and gate electrods, respectively, of the depicted device.

Further, nonconductive spacer portions 26 and 28 are disposed on the sides of the gate oxide portion 18 and the gate electrode 24 of FIG. 1. By way of example, the portins 26 and 28 are made of undoped silicon dioxide.

Radiation incident on the FIG. 1 device is represented by dash line 30. As discussed earlier above, such radiation causes electron/hole pairs to be generated in the gate oxide portion 18.

Illustratively, the FIG. 1 device is shown connected to associated bias voltges for operation in the aforementioned on-line mode. Specifically, a positive direct-current voltage designated $+V_G$ is indicated as being connected to the gate electrode 24 and a negative direct-current voltage designated $-V_D$ is shown connected to the drain electrode 22. Additionally, the source electrode 20 and the substrate 10 are shown connected to a point of reference potential such as ground. Drain current is measured by ammeter 31.

One advantageous embodiment of applicants' invention comprises a p-channel depletion-mode MOS device of the ring-gate type. Such a device design is relatively easy to make and well-suited to serve as the basis for an inexpensive discrete detector. A specific illustrative embodiment of such a ring-gate radiation detector is depicted in FIGS. 2 (cross-sectional side view) and 3 (top view).

Figure 2:
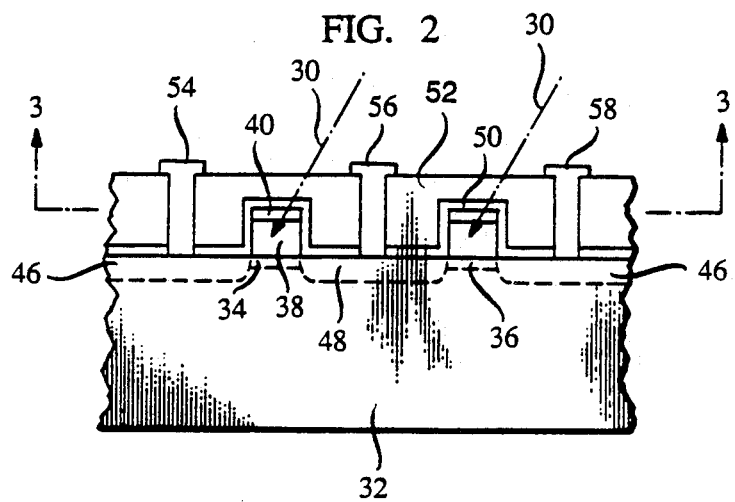
FIGS. 2 and 3 are side and top views, respectively, of a specific illustrative ring-gate MOS device that embodies applicants' inventive principles.
Figure 3:
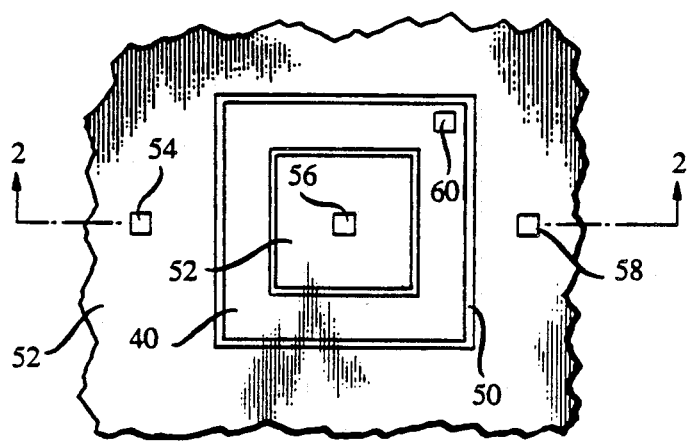

A significant advantage of the device represented in FIGS. 2 and 3 is that it can be made relatively easily and inexpensively. Specifically, as will be detailed below, the depicted device can be fabricated utilizing only three masks.

Also, the ring-gate device does not require a field-oxide layer which itself could be a major trapper of holes. In practice, the presence of a field-oxide layer in the measuring device can deleteriously affect the accuracy and sensitivity of radiation-dose measurements.

Advantageously, devices made in accordance with the principles of the present invention are fabricated in a manner to enhance the density of hole traps in the gate oxide thereof. Accordingly, the specific illustrative fabrication sequency described below for making a ring-gate device includes steps for achieving such enhancement.

FIG. 2 shows a conventional n-type silicon substrate 32 commonly employed to make MOS devices. In accordance with applicants' invention, the first step involved in processing the substrate 32 to form a ring-gate device therein is to implant p-type ions such as boron ions into the entire top surface of the substrate to establish a relatively shallow p-type zone therein. Regions 34 and 36 in FIG. 2 comprise spaced-apart portions of that p-type zone.

Next, a relatively thick layer of silicon dioxide is grown on the entire top surface of the substrate 32 shown in FIG. 2. Illustratively, this layer is designed to be about 1000-to-5000 Angstrom units (Å) thick. In accordance with applicants' invention, it is advantageous to establish a relatively high density of hole traps in this layer. By way of example, this is achieved by growing the oxide at a temperature of approximately 1000-to-1100 degrees Celsius (C) and then annealing the grown oxide in argon at a temperature of about 1000-to-1100 degrees C.

Subsequently, a layer of $n^+$-doped polysilicon about 2500 Å thick is deposited overlying the entire top surface of the aforedescribed gate oxide layer. Illustratively, the polysilicon layer is annealed at a temperature of about 950 degrees C.

In the first processing step that requires a mask, the polysilicon/oxide layers on the substrate 32 of FIG. 2 are then selectively etched in conventional ways to define a ring-type gate pattern therein. This pattern comprises a closed ring including gate oxide portion 38 with an overlying $n^+$-polysilicon portion 40, as shown in FIG. 2.

Source/drain regions are then formed in the FIG. 2 structure by, for example, implanting p-type ions such as boron ions into the surface portions of the substrate 32 that are not masked by the aforedescribed gate pattern. After annealing at a temperature of about 950 degrees C, these regions comprise source region 46 and drain region 48 which are shown in FIG. 2.

Next, a layer of a suitable dielectric material such as undoped silicon dioxide is deposited on the exposed portions of the top surface of the substrate 32 and on the sides and tops of the gate pattern shown in FIG. 2. Illustratively, this dielectric layer is about 1000-to-5000 Åthick. This layer, with later-formed windows included therein, is designated in FIG. 2 by reference numeral 50.

In further accord with applicants' fabrication sequence, the layer 50, without windows yet formed therein, is then covered with a deposited layer of, for example, phosphorus-doped silicon dioxide (so-called P-glass) about one micrometer thick. To enhance the radiation sensitivity of the depicted device, it is advantageous to anneal the P-glass layer. Illustratively, annealing is carried out in a hydrogen atmosphere for about one hour at a temperature of approximately 500-to-700 degrees C.

In a step that requires another (the second) mask, source/drain contact windows or apertures are then etched through the P-glass layer and the underlying layer 50. The resulting P-glass layer 52 is shown in FIG. 2.

In the same step in which source/drain contact windows are formed in the P-glass layer 52, a contact window (not shown in FIG. 2) is also etched in the layer 52 to expose an underlying part of the n+-polysilicon layer 40. A suitable conductive material such as aluminum is then deposited in the contact windows and on the top surface of the P-glass layer 52. Patterning of the conductive material, utilizing another mask (the third mask of the fabrication sequence), is then carried out. The resulting portions of the conductive pattern that contact the source/drain regions are designated 54, 56 and 58 in FIG. 2. (In the particular described embodiment, only one of the depicted portions 54 and 58 is required to establish contact to the source region 46.) The portion of the conductive pattern that contacts the n+-polysilicon layer 40 of the gate pattern is designated 60 in the top view of FIG. 3.

The undoped silicon dioxide layer 50 around the gate pattern shown in FIG. 2 serves as a blocking layer. Specifically, the layer 50 serves to prevent phosphorus in the P-glass layer 52 from migrating into the gate oxide portion 38. If such movement occurred, the efficiency of trapping holes in surface regions of the gate oxide portion 38 could be affected and, as a result, the relationship between incident radiation and threshold-voltage change could be made less predictable. In turn, the measurement of radiation dose could be thereby made less accurate.

Finally, it is to be understood that the above-described arrangements and techniques are only illustrative of the principles of the present invention. In accordance with these principles, numerous modifications and alternatives may be devised by those skilled in the art without departing from the spirit and scope of the invention. Thus, for example, other materials exhibiting advantageous hole trapping properties may be substituted for the silicon dioxide material utilized to form the gate portion 18 (FIG. 1) and the gate portion 38 (FIG. 2). An illustrative such substitute material comprises semi-insulating polycrystalline silicon (SIPOS).

What is claimed is:

1. In combination,
   a p-channel depletion-mode MOS device adapted to be interposed in a path of non-particle ionizing radiation,
   and means for determining, for a given gate voltage applied to said device, the change in source-to-drain current that results from irradiation of said device with said non-particle ionizing radiation thereby to provide a measurement of the non-particle radiation dose to which said device was exposed wherein said device comprises a gate pattern including an insulating layer of said gate having a conductive gate layer thereon, said conductive gate layer comprising n+polysilicon.

2. A combination as in claim 1 wherein said insulating layer of said gate comprises silicon dioxide.

3. A combination as in claim 1 wherein said insulting layer of said gate comprises SIPOS.

4. A combination as in claim 1 wherein said device comprises a gate pattern having a closed ring structure.

5. A method of measuring non-particle ionized radiation dose, comprising the step of
   interposing a p-channel depletion-mode MOS device in the path of radiation whose dose is to be measured and for a given gate voltage measuring the change in drain current that occurs in said device as a result of being irradiated wherein said device comprises source and drain contacts and a gate pattern that includes an insulating layer of said gate having an n+polysilicon layer thereon.

6. A method as in claim 5,
   wherein during the time that said device is exposed to radiation, an external positive bias voltage is connected to said n+polysilicon layer and an external negative bias voltage is applied to said drain contact.

7. A method as in claim 5 wherein during the time that said device is exposed to radiation, no external bias voltages are applied to said device.

* * * * *